United States Patent [19]

Tokura et al.

[11] Patent Number: 5,696,396

[45] Date of Patent: Dec. 9, 1997

[54] SEMICONDUCTOR DEVICE INCLUDING VERTICAL MOSFET STRUCTURE WITH SUPPRESSED PARASITIC DIODE OPERATION

[75] Inventors: Norihito Tokura, Okazaki; Kunihiko Hara, Nukata-gun; Takeshi Miyajima, Kariya, all of Japan

[73] Assignee: Nippondenso Co., Ltd., Kariya, Japan

[21] Appl. No.: 734,132

[22] Filed: Oct. 21, 1996

Related U.S. Application Data

[63] Continuation of Ser. No. 339,208, Nov. 10, 1994, abandoned.

[30] Foreign Application Priority Data

Nov. 12, 1993 [JP] Japan .................. 5-283240

[51] Int. Cl.$^6$ .............. H01L 29/76; H01L 31/0312; H01L 29/94; H01L 31/062
[52] U.S. Cl. .............. 257/341; 257/77; 257/330; 257/331; 257/337
[58] Field of Search .................. 257/329, 330, 257/331, 332, 337, 339, 341, 342, 77

[56] References Cited

U.S. PATENT DOCUMENTS

| | | | |
|---|---|---|---|
| 4,837,606 | 6/1989 | Goodman et al. | 257/341 |
| 4,985,743 | 1/1991 | Tokura et al. | 257/337 |
| 5,170,231 | 12/1992 | Fujii | 257/77 |
| 5,233,215 | 8/1993 | Baliga | 257/490 |
| 5,323,040 | 6/1994 | Baliga | 257/332 |
| 5,389,799 | 2/1995 | Uemoto | 257/77 |
| 5,399,515 | 3/1995 | Davis | 437/40 |
| 5,506,421 | 4/1996 | Palmour | 257/77 |

FOREIGN PATENT DOCUMENTS

| | | | |
|---|---|---|---|
| 399530 | 11/1990 | European Pat. Off. | 257/337 |
| 3824836 | 2/1989 | Germany | 257/337 |
| 59-74674 | 4/1984 | Japan | 257/337 |
| 61-80858 | 4/1986 | Japan | 257/337 |
| 62-12167 | 1/1987 | Japan | 257/329 |
| 1134974 | 5/1989 | Japan | 257/331 |
| 1135072 | 5/1989 | Japan | 257/342 |
| 1310576 | 12/1989 | Japan | 257/329 |
| 4-239778 | 8/1992 | Japan | 257/77 |
| 5-102497 | 4/1993 | Japan | 257/77 |

OTHER PUBLICATIONS

Suzuki et al., "Thermal Oxidation of SiC and Electrical Properties of Al–SiO$_2$–SiC MOS Structure", *Japanese Journal of Applied Physics*, Apr. 1982, pp. 579–585.

Palmour, et al: "6H–Silicon Carbide Power Devices for Aerospace Application", Proceedings of the 28th Intersociety Energy Conversion Engineering Conference, vol. 1, Aug. 8–13, 1993 pp. 1249–1254.

*Primary Examiner*—Steven H. Loke
*Attorney, Agent, or Firm*—Cushman, Darby & Cushman IP Group of Pillsbury, Madison & Sutro, LLP

[57] ABSTRACT

A vertical MOSFET, which can control AC current flowing through a device only by the gate voltage, is obtained. On an n$^+$ silicon layer is formed an n$^-$ silicon layer. Within the n$^-$ silicon layer is formed a p-body region. Within the p-body region is formed an n$^+$ source region. On top of a substrate are formed a source electrode in contact only with the source region and a base electrode in contact only with the p-body region. The source electrode and the base electrode are connected to each other through a resistance at the outside. On a channel region is formed a gate electrode through a gate oxide film (insulating film). When the above semiconductor device is in the reverse bias conduction, the exciting current is controlled only by the gate voltage by setting the current flowing from a source terminal through the resistance to the base electrode, the p-body region and the n$^-$ silicon layer to be negligibly small as compared with the current flowing from the source terminal through the source electrode to the n$^+$ source region, the channel region and the n$^-$ silicon layer.

28 Claims, 12 Drawing Sheets

SEMICONDUCTOR DEVICE INCLUDING VERTICAL MOSFET STRUCTURE WITH SUPPRESSED PARASITIC DIODE OPERATION

CROSS REFERENCE TO RELATED APPLICATION

This is a continuation of application Ser. No. 08/339,208, filed on Nov. 10, 1994, which was abandoned.

This application claims the benefit of priority of the prior Japanese patent application No. 5-283240 filed on Nov. 12, 1993, the contents of which are incorporated herein by reference.

BACKGROUND OF THE INVENTION

1. Field of the Invention

The present invention generally relates to a semiconductor device. More particularly, the present invention relates to a semiconductor device having a vertical MOSFET (Metal-Oxide-Semiconductor Field-Effect Transistors) structure.

2. Description of the Related Arts

FIG. 12 is a cross-sectional view illustrating the structure of a conventional n-channel type DMOSFET (Diffused self-alignment MOSFET). In this figure, a semiconductor substrate 125 is composed of two layers, an $n^+$ silicon layer 111 and an $n^-$ silicon layer 112, and substrate 125 operates as a drain region. By forming a gate electrode 117 on top of the semiconductor substrate 125 with a gate oxide film (insulating film) 116 disposed therebetween and doubly diffusing p-type impurities and n-type impurities using the gate electrode 117 as a common mask, a p-body region 113 and an $n^+$ source region 114 are formed. A channel region 118 is defined within the surface region of the p-body region 113. A source electrode 119 is formed all over the top of the semiconductor substrate 125 to be electrically connected to the p-body region 113 and the $n^+$ source region 114. A metal drain electrode 120 is formed all over the bottom of the semiconductor substrate 125 so as to be electrically connected to the $n^+$ silicon layer 111. The gate electrode 117, the source electrode 119 and the drain electrode 120 are connected to a gate terminal G, a source terminal S and a drain terminal D, respectively.

Now, the operational principal of this prior art transistor will be described.

First, the case where the transistor is forwardly biased will be described. When a main voltage is applied in such a way that the drain terminal D is high in electrical potential and the source terminal S is low in electric potential and a forward bias is applied to the gate terminal G, an inversion layer is formed within the channel region 118, and electrons flow from the $n^+$ source region 114 through the channel region 118 into the $n^-$ silicon layer 112. As a result of this flow of electrons, electronic current (control current) 121 flows and the transistor is turned to the ON state. FIG. 13 is a graph illustrating the relation between drain current $I_D$, i.e., electronic current 121, and drain-source voltage $V_{DS}$. The details of the electric characteristics when the transistor is in the ON state with forward conduction are illustrated in the first quadrant of FIG. 13. As the voltage $V_{DS}$ increases, the current $I_D$ increases and becomes saturated at a certain current value. When gate-source voltage $V_{GS}$ is increased, a characteristic that the saturation amperage increases appears.

Second, the case where the transistor is reverse biased will be described. Main voltage is applied in such a way that the drain terminal D is low in electrical potential and the source terminal S is high in electric potential. When the main voltage is lower than a certain voltage (e.g., −0.7V) and a forward bias is applied to the gate terminal G, an inversion layer is formed within the channel region 118, and electrons flow from the $n^-$ silicon layer 112 through the channel region 118 into the $n^+$ source region 114. As a result of this flow of electrons, electronic current 122 flows and the transistor is turned to the ON state.

On the other hand, when the main voltage is higher than a certain voltage (e.g., −0.7V), a parasitic diode 123 formed between the p-body region 113 and the silicon layer 112 operates. This is because the cathode terminal of the parasitic diode 123 is connected to the drain terminal D and the anode terminal of the same is connected to the source terminal S. Therefore, the parasitic diode 123 is forward biased and the transistor is turned to the ON state regardless of the bias voltage of the gate terminal G. Therefore, in the equivalent circuit of the n-channel type DMOSFET illustrated in FIG. 12, a MOSFET 127 and the parasitic diode 123 are connected in parallel to each other as illustrated in FIG. 14. The details of the electric properties when the transistor is ON with a reverse bias are illustrated in the third quadrant of FIG. 13. The conduction characteristics of the parasitic diode 123 are indicated by a curve A in FIG. 13. As illustrated in FIG. 13, the drain current $I_D$ can take amperage controlled by the gate-source voltage $V_{GS}$ only within the region where the voltage is lower than the voltage defined by the curve A.

FIG. 15 is a cross-sectional view illustrating the structure of a conventional n-channel UMOSFET (U-Shaped MOSFET). The n-channel UMOSFET has the same forward and reverse conduction characteristics as those of the n-channel DMOSFET illustrated in FIG. 12, and has the same electric characteristics and equivalent circuit illustrated in FIG. 13 and FIG. 14 respectively.

With respect to the electric characteristics of conventional DMOSFETs and UMOSFETs in the reverse biased state, the drain current $I_D$ is defined by the parasitic diode characteristics regardless of the gate-source voltage $V_{GS}$ with respect to the drain-source voltage $V_{DS}$ higher than the forward ON voltage (threshold) of the parasitic diode 123 (e.g., 1V or more).

As described above, in the DMOSFET and UMOSFET illustrated in FIGS. 12 and 15 respectively, the current $I_D$ cannot be controlled by the bias voltage of the gate terminal with respect to the drain-source voltage $V_{DS}$ higher than the forward ON voltage of the parasitic diode 123 (e.g., 1V or more) and therefore, electric conduction can not always be prevented. For this reason, when a large reverse-bias is applied, the circuit positioned downstream therefrom is subject to adverse effects. Therefore, to prevent such adverse effects in circuits subjected to reverse bias, a blocking diode 128 is connected in series to the drain terminal D as illustrated in FIG. 16 so that the blocking diode 128 can be reverse biased to forcedly block the conduction when main voltage is applied so that the anode terminal A is low in electric potential and the source terminal S is high in electric potential. The details of the electric characteristics when the blocking diode 128 is connected are illustrated in FIG. 17. The forward electric characteristics illustrated in FIG. 17 are the electric characteristics illustrated in FIG. 13 but shifted to the right by the amount of the forward voltage drop $V_{AD}$ (e.g., 0.7V) of the blocking diode 128.

However, in the semiconductor device illustrated in FIG. 16, a problem exists in that reverse bias signals can be blocked, but cannot be switched.

For example, to switch AC signals, a pair of circuits illustrated in FIG. 16 must be connected so as to be reverse parallel to each other as illustrated in FIG. 18. Therefore, in the circuit illustrated in FIG. 18, a problem exists that the number of parts and components, as well as the volume taken up by the device, are doubled. There is also a problem that due to the voltage drop at forward conduction, the forward voltage drop $V_{AD}$ (e.g., 0.7V) of the blocking diode 128 is added to the voltage drop of the MOSFET 127, resulting in increase in voltage loss.

SUMMARY OF THE INVENTION

In view of the above problem, it is an object of the present invention to provide a vertical MOSFET which can be controlled with respect to both forward and reverse biases and does not increase the voltage loss without increasing (by minimizing) the number of parts and components and the volume of the device.

The semiconductor device that achieves the above object is a semiconductor device having a MOSFET structure which can control the current flowing therethrough by the voltage applied to a gate electrode. This semiconductor device comprises a semiconductor substrate having a low-resistance semiconductor layer of a first conductivity type and a high-resistance semiconductor layer of the first conductivity type formed on the low-resistance semiconductor layer; a body region of a second conductivity type formed on the semiconductor substrate; a source region of the first conductivity type formed within the body region and having a resistance lower than that of the high-resistance semiconductor layer; a source electrode contacting the source region; a gate electrode located on the surface of the body region with an insulating film disposed therebetween for forming a channel region at a surface of the body region between the high-resistance semiconductor layer and the source region; and a current controlling means connected between the body region and the source electrode for controlling a control current flowing from the source region to the semiconductor substrate via the channel region so as to predominate over a parasitic diode current flowing from the body region to the semiconductor substrate.

In the semiconductor device composed as above, the electric potential of the body region to the source region is determined by connecting a current controlling means between the body region and the source region. Furthermore, by varying the electric potential of the gate electrode, a channel region is formed at the surface of the body region between the high-resistance semiconductor layer and the source region. That is, when a forward bias is applied between the semiconductor substrate and the source electrode (when "n-type" is adopted as the first conductivity type, the drain electrode is positive with respect to the source electrode, and on the other hand, when "p-type" is adopted as the first conductivity type, the drain electrode is negative with respect to the source electrode), carriers flow through a passage from the source electrode to the source region, to the channel region and to the semiconductor substrate during the gate driven time, and as a result, control current flows. Here, when a forward bias is applied, as the P-N junction between the semiconductor substrate of the first conductivity type and the body region of the second conductivity type is reverse biased, electric current does not flow through a parasitic diode composed by this P-N junction.

On the other hand, when a reverse bias is applied (when "n-type" is adopted as the first conductivity type, the drain electrode is negative with respect to the source electrode; on the other hand, when "p-type" is adopted as the first conductivity type, the drain electrode is positive with respect to the source electrode), there are two different types of current flowing through the semiconductor device during the time that the gate is driven. One current is a control current based on the carriers flowing through the channel region, and the other current is a parasitic diode current that flows while forwardly biasing the P-N junction between the body region and the semiconductor substrate. However, of these two different types of current, as the parasitic diode current is controlled by the current controlling means disposed between the body region and the source electrode, the control current substantially predominates as the current flowing through the whole semiconductor device. Furthermore, as this control current flows through the channel region, the amperage thereof can be controlled by the voltage applied to the gate electrode.

In the semiconductor device described above, the amperage of the current flowing through the same device can be controlled for both forward and reverse biases according to the voltage applied to the gate electrode. In addition, according to the present invention, there is no need to connect a blocking diode outside the circuit. Thus, the voltage loss does not increase. Therefore, a semiconductor device can be obtained which can control the amperage for both forward and reverse biases and does not increase the voltage loss without increasing (by minimizing) the number of parts and components and the volume of the device.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PREFERRED EMBODIMENTS

[First Embodiment]

The first embodiment of a semiconductor device according to the present invention will be described with reference to the appended figures.

Figure 1:
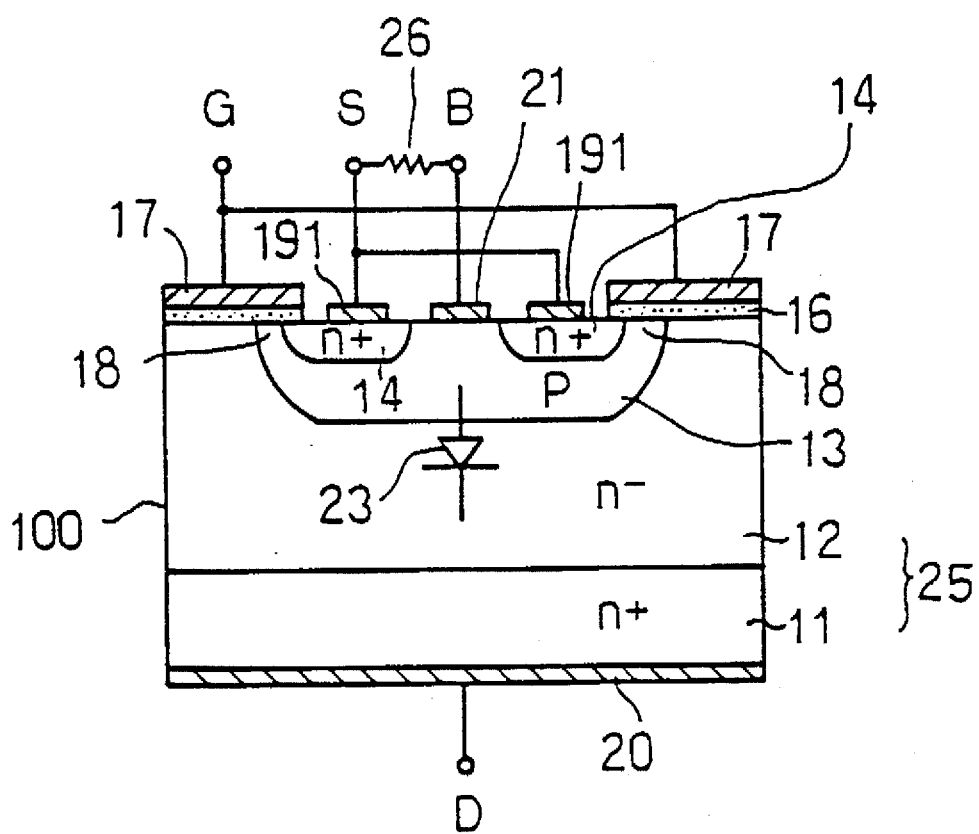
FIG. 1 is a cross-sectional view illustrating the first embodiment of an n-channel type DMOSFET according to the present invention.

FIG. 1 is a cross-sectional view illustrating an embodiment of the present invention used in an n-channel type DMOSFET 100, which is a power semiconductor device. In this embodiment, "n-type" is used as the first conductivity type, and "p-type" is used as the second conductivity type. Schematically, in the n-channel DMOSFET 100 of this embodiment, an n⁻ silicon layer 12 (high-resistance semiconductor layer) is formed on an n⁺ silicon layer 11 (low-resistance semiconductor layer), and these two silicon layers 11 and 12 compose a semiconductor substrate 25. Within the n⁻ silicon layer 12 is formed a p-body region 13 (first semiconductor region). Within the p-body region 13 is formed an n⁺ source region 14 (second semiconductor region). On top of the silicon substrate 25 are formed a source electrode 191 electrically in contact only with the n⁺ source region 14 and a base electrode 21 electrically in contact only with the p-body region 13. The base electrode 21 is connected to a base terminal B. The base terminal B is connected to a source terminal S through a resistance 26. On top of the silicon substrate is formed a gate electrode 17, with a gate oxide film (insulating film) 16 disposed therebetween.

Next, description will be given concerning the operational principle of this embodiment of the semiconductor device described above.

Figure 2:
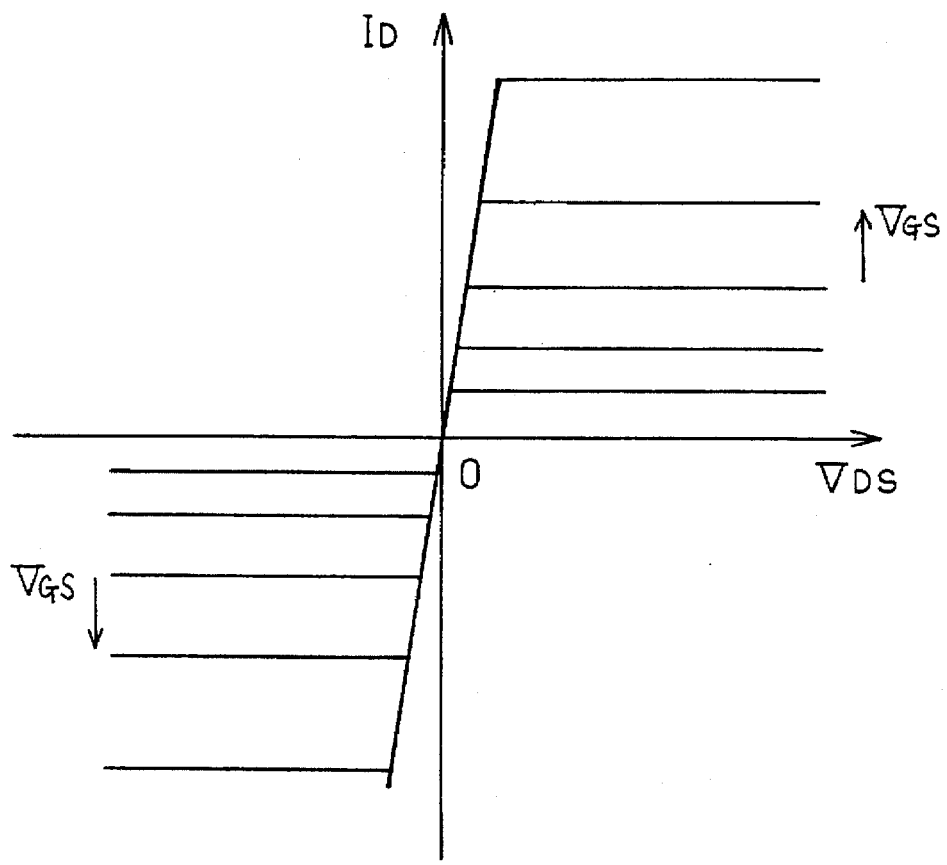
FIG. 2 is a graph illustrating the electric characteristics of the n-channel type DMOSFET of FIG. 1.

First, the case of forward conduction will be described, which is the same as the case with the above-described n-channel type DMOSFET. Main voltage is applied to the semiconductor device in such a way that a drain terminal D can be at a high potential while the source terminal S can be at a low potential. At this time, as the PN junction between the p-body region 13 and the n⁻ silicon layer 12 is reverse biased, no current flows through a parasitic diode 23 formed between the p-body region 13 and the n⁻ silicon layer 12. There is no voltage drop caused by the resistance 26, and the source potential is applied to the p-body region 13. When a positive bias is applied to a gate terminal G, an inversion layer is formed within the channel region 18 and electrons flow from the n⁺ source region 14 through the channel region 18 into the n⁻ silicon layer 12, so that the n-channel type DMOSFET 100 is turned to the ON state. FIG. 2 is a graph illustrating characteristics between the drain current $I_D$ and the drain-source voltage $V_{DS}$. The details of the electric characteristics when the transistor is ON in the forward conduction is illustrated in the first quadrant of FIG. 2. As the voltage $V_{DS}$ increases, the current $I_D$ increases and becomes saturated at a specific amperage. On the other hand, as the voltage gate-source $V_{GS}$ is increased, the saturation amperage rises simultaneously.

Figure 13:
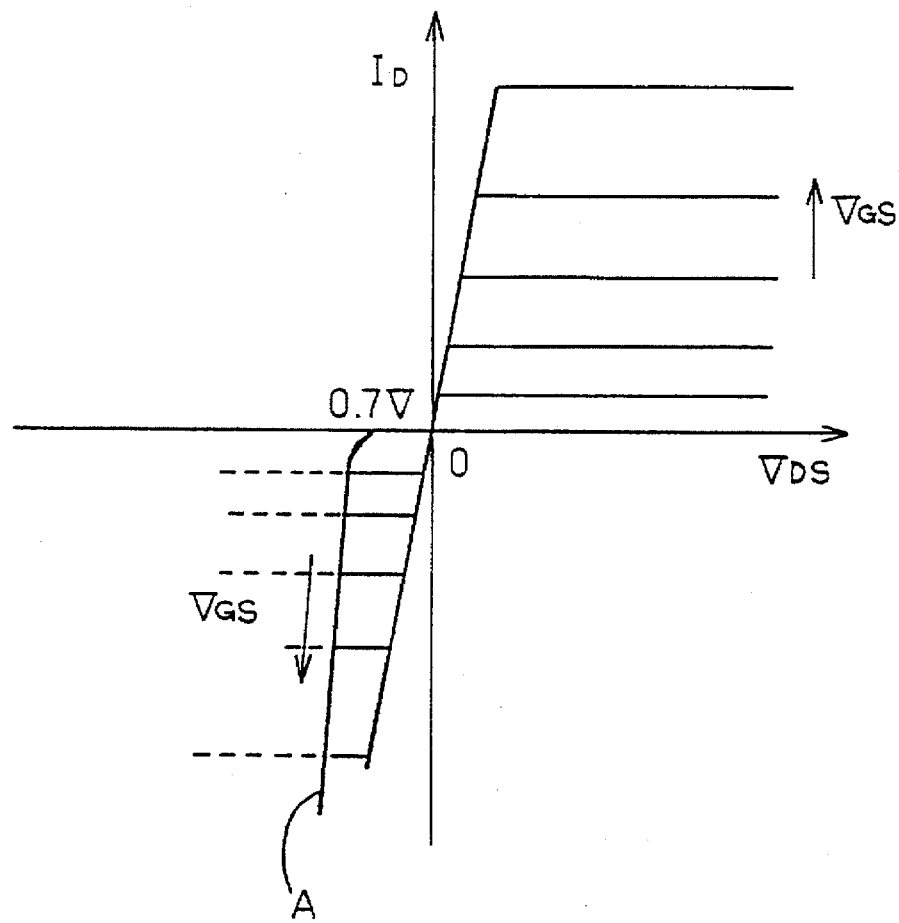
FIG. 13 is a graph illustrating the electric characteristics of conventional N-channel type DMOSFETs and conventional n-channel type UMOSFETs.
Figure 14:
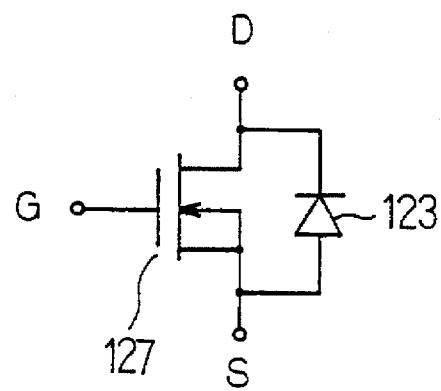
FIG. 14 is a circuit diagram illustrating the equivalent circuit of conventional n-channel type DMOSFETs and conventional n-channel type UMOSFETs.
Figure 15:
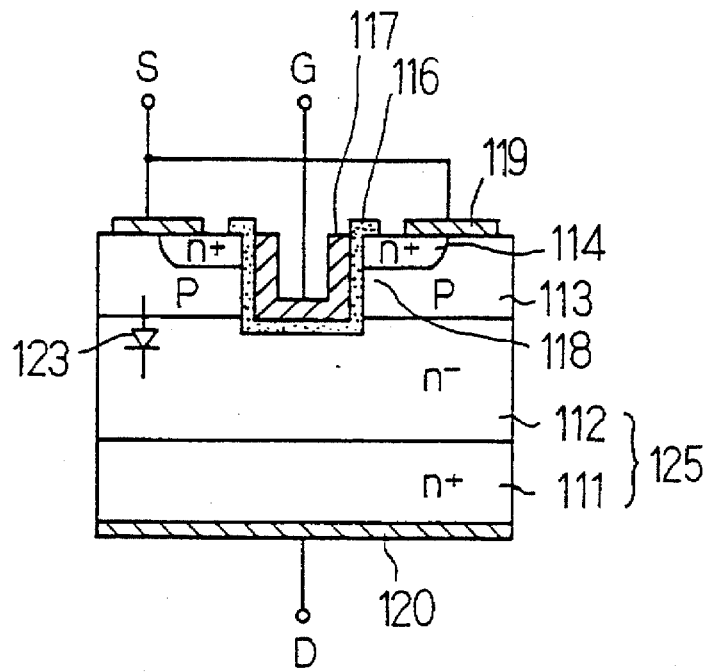
FIG. 15 is a cross-sectional view illustrating a conventional N-channel type UMOSFET.
Figure 16:
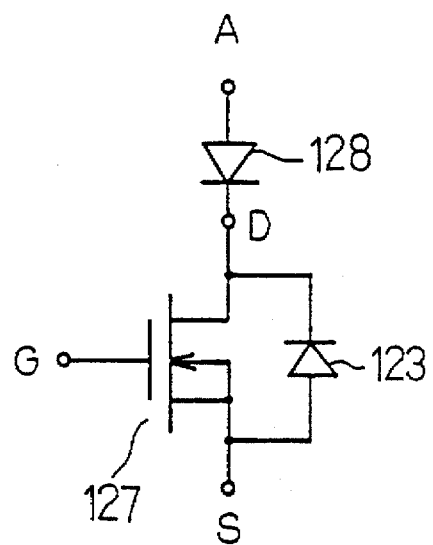
FIG. 16 is a circuit diagram illustrating the equivalent circuit of a conventional n-channel type DMOSFET and UMOSFET provided with a blocking diode connected to the outside thereof.
Figure 17:
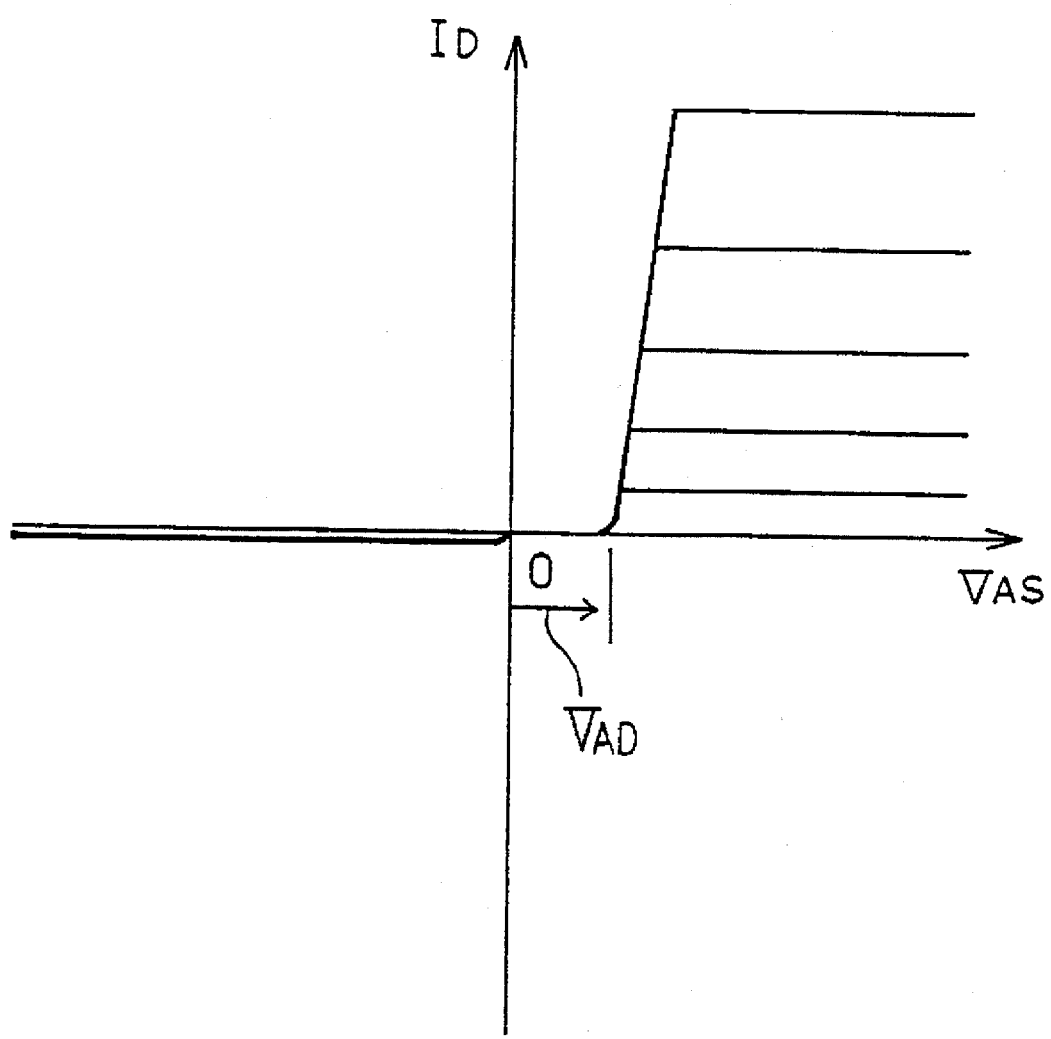
FIG. 17 is a graph illustrating the electric characteristics of a conventional n-channel type DMOSFET and UMOSFET provided with a blocking diode connected to the outside thereof.
Figure 18:
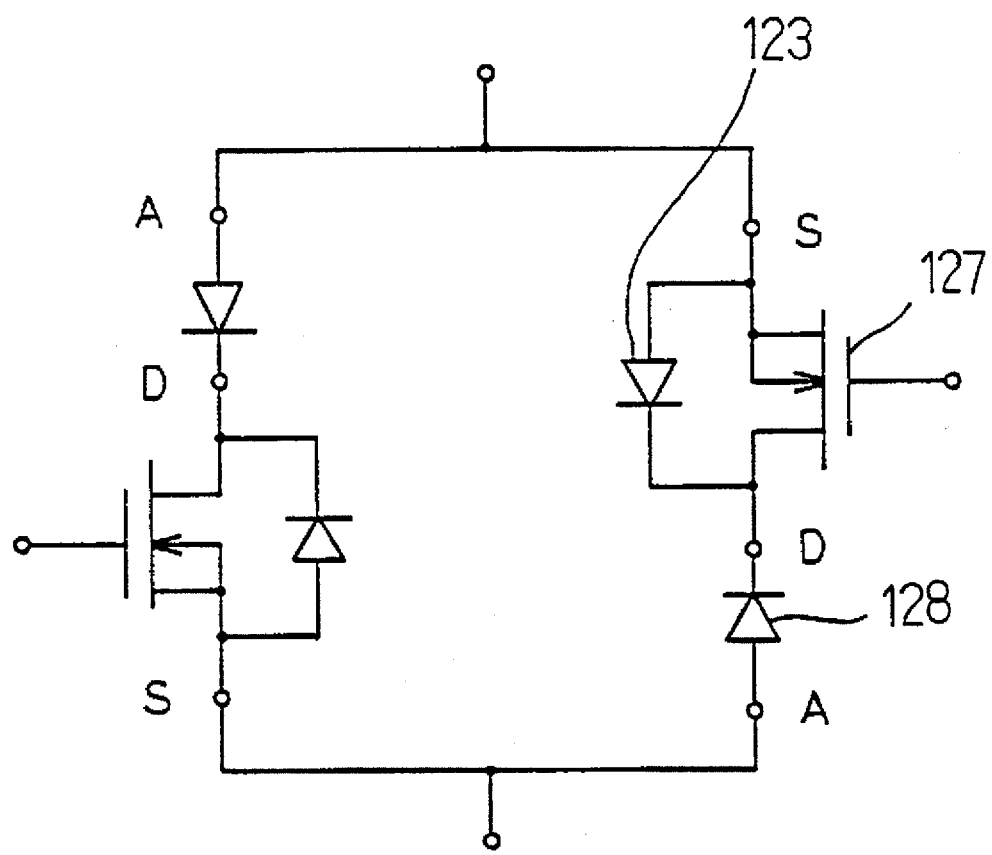
FIG. 18 is a circuit diagram illustrating the equivalent circuit of two pairs of conventional n-channel type DMOSFETs and UMOSFETs connected in reversely parallel to each other and provided with blocking diodes connected to the outside thereof.

Next, the case of reverse conduction will be described. When main voltage is applied so that the drain terminal D can be low in electric potential and the source terminal S can be high in electric potential and a positive bias is applied to the gate terminal G, an inversion layer is formed within the channel region 18, and electrons flow from n⁻ silicon layer 12 at the drain side through the channel region 18 into the n⁺ source region 14, and the n-channel type DMOSFET 100 is turned to the ON state. Consequently, the electric potential of the p-body region 13 near the channel region 18 is fixed to the drain potential. Here, when the main voltage is higher than a certain voltage (e.g., 0.7V), the parasitic diode 23 formed between the p-body region 13 and the n⁻ silicon layer 12 operates at locations off the channel region. This is because the cathode terminal of the parasitic diode 23 is connected to the drain terminal D and the anode terminal of the diode 23 is connected to the source terminal S through the p-body region 13. Therefore, the parasitic diode 23 is forward biased and this semiconductor device is turned ON. Therefore, an equivalent circuit of the n-channel type DMOSFET 100 illustrated in FIG. 1 can be shown by the circuit illustrated in FIG. 3, where the parasitic diode 23 and the resistance 26 are connected in series and a MOSFET 27 is connected in parallel thereto. However, as the resistance 26 is set to be very large, the exciting current of the parasitic diode 23 can be restrained to a low, negligible value as compared with the exciting current of the MOSFET 27 (electronic current flowing through the channel region 18 into the n⁺ source region 14). The details of the electric properties when this semiconductor device is ON in a reverse conduction state are illustrated in the third quadrant of FIG. 2. In this embodiment, the exciting characteristics of the parasitic diode 23 illustrated in the third quadrant of FIG. 13 are blocked by the resistance 26, and with respect to reverse conduction, the characteristics only of the MOSFET 27 appear as illustrated in the third quadrant of FIG. 2. Therefore, the semiconductor device can securely be turned ON and OFF by the gate-source voltage $V_{GS}$. Furthermore, the increase in voltage drop as illustrated in the first quadrant of FIG. 17 does not occur in this embodiment. Therefore, in this embodiment, the current flow through the device can be controlled also with respect to the reverse bias, whereby AC signals can be controlled only by a single n-channel type DMOSFET.

Here, in this embodiment, such a semiconductor device as illustrated in FIG. 1 is used to describe the basic composition. However, for actual use as a power semiconductor device, thousands of the unit cells illustrated in FIG. 1 are connected in parallel. At this time, it is preferable that a single resistance 26 is used per whole device or per any given block. It is a matter of course, however, that the resistance 26 can be used per unit cell. Also the resistance 26 can be formed within other regions on the semiconductor substrate or an external resistance can be connected.

[Second Embodiment]

The second embodiment of a semiconductor device according to the present invention will be described with reference to the appended figures.

Figure 4:
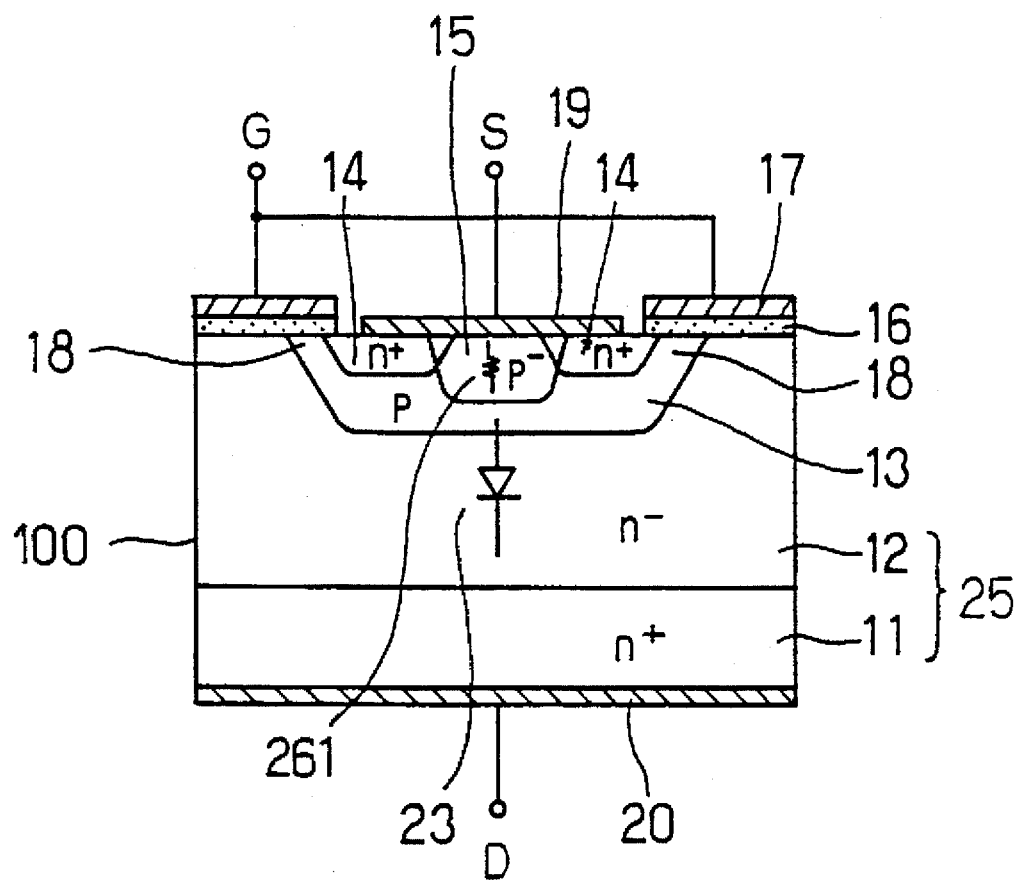
FIG. 4 is a cross-sectional view illustrating the second embodiment of an n-channel type DMOSFET according to the present invention.

FIG. 4 is a cross-sectional view illustrating an embodiment of a n-channel type DMOSFET 100 in which the resistance in the first embodiment is formed within a p-body region 13. Schematically, in this embodiment of the n-channel type DMOSFET 100, on an $n^+$ silicon layer 11 (low-resistance semiconductor layer) is formed an $n^-$ silicon layer 12 (high-resistance semiconductor layer), and these two layers 11 and 12 make up a semiconductor substrate 25. Within the $n^-$ silicon layer 12 is formed a p-body region 13 (first semiconductor region), and within the p-body region 13 are formed an $n^+$ source region 14 (second semiconductor region) and a $p^-$ base region 15 (third semiconductor region). On the substrate 25 are formed a source electrode 19 and a gate electrode 17, the latter being formed through a gate oxide film (insulating film) 16.

Next, description will be given to the operational principle of the semiconductor device described above.

First, the case of forward conduction is the same as the case with the n-channel type DMOSFET illustrated in FIG. 1. When a main voltage is applied in such a way that the drain terminal D can be high in electric potential and the source terminal S can be low in electric potential and a positive bias is applied to the gate terminal G, an inversion layer is formed within a channel region 18 and electronic current flows from $n^+$ source region 14 through the channel region 18 into the $n^-$ silicon semiconductor layer 12, so that the n-channel type DMOSFET is turned to be in the ON state. The relational characteristics between the drain current $I_D$ and the drain-source voltage $V_{DS}$ are the same as those illustrated in the first quadrant of FIG. 2.

Next, the case of reverse conduction will be described.

Figure 3:
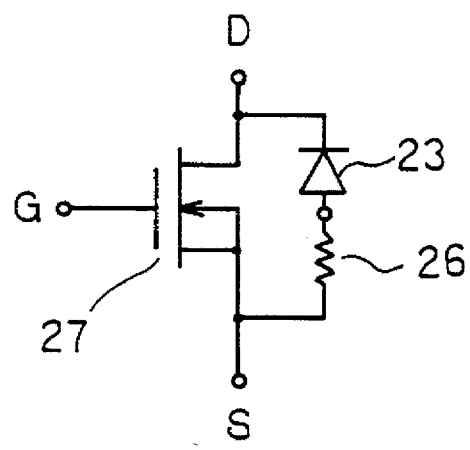
FIG. 3 is a circuit diagram illustrating the equivalent circuit of the n-channel type DMOSFET of FIG. 1.

When a main voltage is applied in such a way that the drain terminal D is low in electric potential and the source terminal S is high in electric potential and a positive bias is applied to the gate terminal G, an inversion layer is formed within the channel region 18 and electronic current flows from the $n^-$ silicon layer 12 through the channel region 18 into the $n^+$ source region 14, and therefore the n-channel type DMOSFET 100 is turned to be in the ON state. When the main voltage is higher that a certain voltage (e.g., 0.7V), a parasitic diode 23 formed between the p-body region 13 and the $n^-$ silicon layer 12 operates. The equivalent circuit of the n-channel type DMOSFET 100 illustrated in FIG. 4 is shown by a circuit in which the parasitic diode 23 and the resistance 261 of the $p^-$ base region 15 are connected in series and the MOSFET 27 is connected in parallel thereto as illustrated in FIG. 3. Here, the concentration of impurities within the $p^-$ base region 15 is set to be very low, so that the resistance 261 is set to be very large. Therefore, the exciting current of the parasitic diode 23 can be restrained to be negligibly small as compared with the exciting current of the MOSFET 27 (electronic current flowing through the channel region 18 into the $n^+$ source region 14). The details of the electric characteristics when the semiconductor device is ON with reverse conduction are illustrated in the third quadrant of FIG. 2 as in the first embodiment. The conduction characteristics of the parasitic diode 23 illustrated in the third quadrant in FIG. 2 are blocked by the resistance 261, and with respect to reverse conduction, the characteristics only of the MOSFET 27 appear as illustrated in the third quadrant of FIG. 2. That is, the drain current $I_D$ flowing through the device can securely be turned ON and OFF by the gate-source voltage $V_{GS}$. In addition, increases in the voltage drop, as seen in the first quadrant of FIG. 17, do not occur. Therefore, also in this embodiment, the current flowing through the device can be controlled with respect to reverse bias, whereby AC signals can be controlled only by a single n-channel DMOSFET.

Also in this embodiment, when the device is actually used as a power semiconductor device, thousands of the unit cells illustrated in FIG. 4 are connected in parallel.

[Third Embodiment]

The third embodiment of a semiconductor device according to the present invention will be described with reference to the appended figures.

Figure 5:
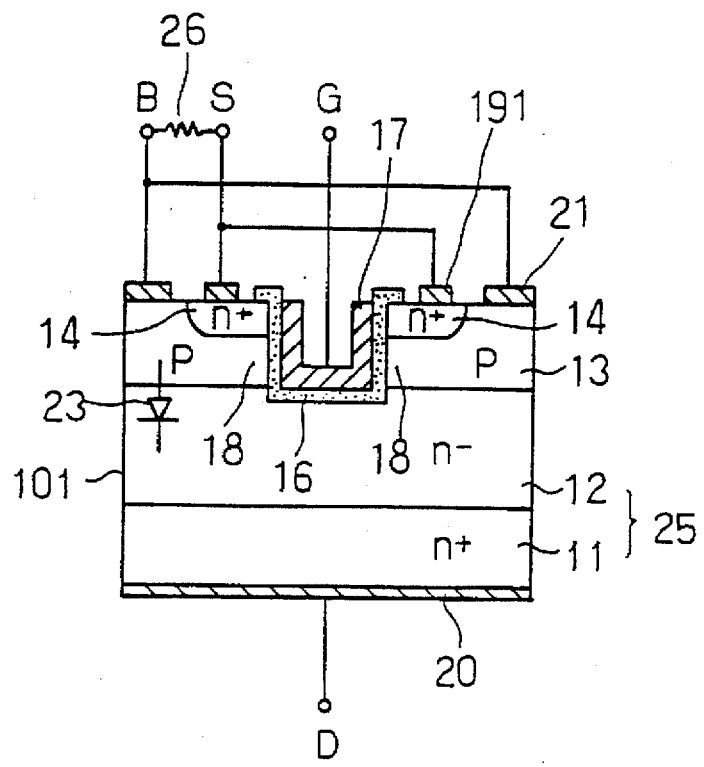
FIG. 5 is a cross-sectional view illustrating the third embodiment of an N-channel type UMOSFET according to the present invention.

FIG. 5 is a cross-sectional view of an n-channel type UMOSFET 101 to which a power semiconductor device according to the present invention is applied. Schematically, in this embodiment of the n-channel type UMOSFET 101, on the $n^-$ silicon layer 12 is formed a p-body region 13, and within the p-body region 13 is formed an $n^+$ source region 14. A trench of a gate oxide film (insulating film) 16 is formed extending from the top side of a substrate 25 to the $n^-$ silicon layer 12, and through the gate oxide film (insulating film) 16 is formed a gate electrode 17. On top of the substrate 25 are formed a source electrode 191 electrically in contact only with the $n^+$ source region 14 and a base electrode 21 electrically in contact only with the p-body region 13. The base electrode 21 is connected to a base terminal B, and the base terminal B is connected to a source terminal S through a resistance 26.

Now description will be given to the operational principle of this embodiment. The equivalent circuit of this embodiment of the n-channel type UMOSFET 101 is the same circuit as that of the n-channel type DMOSFET of FIG. 1, with the circuit illustrated in FIG. 3. The electric characteristics thereof are the same as those illustrated in FIG. 2. Accordingly, also in this embodiment, the conduction characteristics of a parasitic diode 23 are blocked by the resistance 26 connected to the outside as in the first embodiment. In this embodiment, the drain current flowing through the device can be controlled by the gate voltage also with respect to a reverse bias without increasing the current loss. Therefore, also in this embodiment, an n-channel type UMOSFET which can control AC signals with the minimum number of parts and components can be obtained.

[Fourth Embodiment]

The fourth embodiment of a semiconductor device according to the present invention will be described with reference to the appended figures.

Figure 6:
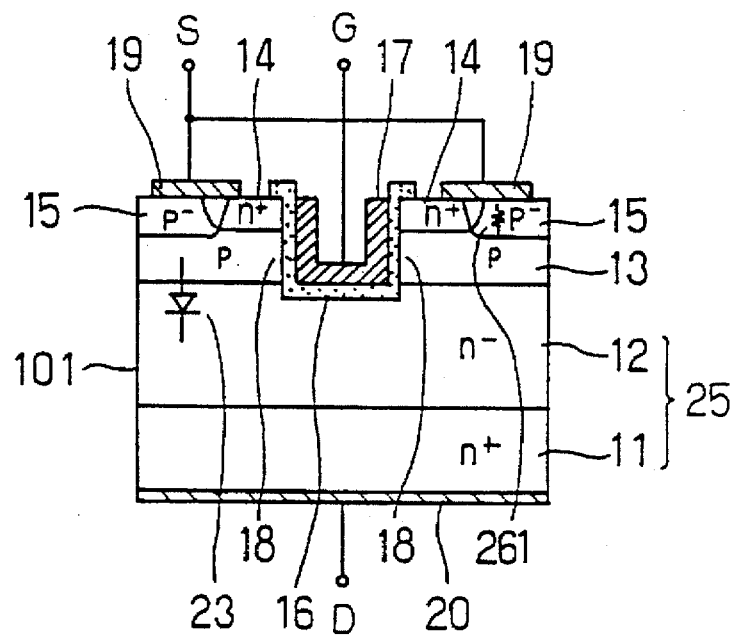
FIG. 6 is a cross-sectional view illustrating the fourth embodiment of an N-channel type UMOSFET according to the present invention.

FIG. 6 is a cross-sectional view illustrating an n-channel type UMOSFET 101 in which the resistance used in the third embodiment is formed within a p-body region 13. Schematically, in this embodiment of the n-channel type UMOSFET 101, on an $n^-$ silicon layer 12 is formed a p-body region 13, and within the p-body region 13 are formed an $n^+$ source region 14 and a $p^-$ base region 15. A trench of a gate oxide film (insulating film) 16 is formed extending from the top side of the substrate to the $n^-$ silicon layer 12, and through the gate oxide film (insulating film) 16 is formed a gate electrode 17.

Next, the operational principle of this embodiment will be described. The equivalent circuit of this embodiment of the n-channel type UMOSFET 101 is the same as the circuit shown in FIG. 3, which is the circuit for the n-channel type DMOSFET illustrated in FIG. 1. The electric characteristics thereof are the same as those illustrated in FIG. 2. Accordingly, also in this embodiment, the conduction characteristics of a parasitic diode 23 are blocked by the resistance 261 formed in the $p^-$ base region 15 as in the second embodiment. In this arrangement, the drain current flowing through the device can be controlled by the gate voltage also with respect to a reverse bias without increasing the current loss. Therefore, also in this embodiment, an n-channel type UMOSFET which can control AC signals without increasing the number of parts and components can be obtained.

[Fifth Embodiment]

The fifth embodiment of a semiconductor device according to the present invention will be described with reference to the appended figures.

Figure 7:
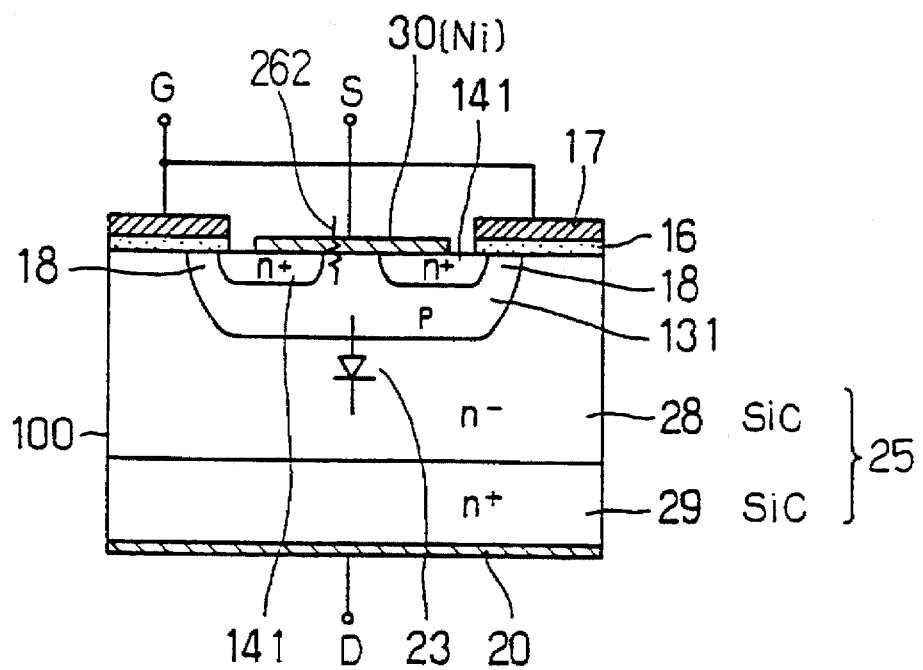
FIG. 7 is a cross-sectional view illustrating the fifth embodiment of an n-channel type DMOSFET according to the present invention.

FIG. 7 is a cross-sectional view illustrating an n-channel type DMOSFET 100 which is the fifth embodiment of a semiconductor device according to the present invention. Schematically, in this embodiment of the n-channel type DMOSFET 100, a semiconductor substrate 25, a p-body region 131 and an n$^+$ source region 141 are hexagonal system SiC single crystals. Here, the azimuth of the surface of the semiconductor substrate 25 is the (0001) plane, and on this plane is formed a p-body region 131 by epitaxial growth. A Ni source electrode 30 electrically in contact with and common to the p-body region 131 and the n$^+$ source region 141 is formed using nickel ("Ni"). In this arrangement, the contact resistance of the part where the p-body region 131 is in contact with the Ni source electrode 30 is set to be larger than that of the part where the n$^+$ source region 141 is in contact with the Ni source electrode 30, and a resistance 262 is substantially formed in the part where the p-body region 131 is in contact with the Ni source electrode 30. Accordingly, the equivalent circuit of the n-channel type DMOSFET 100 illustrated in FIG. 7 is the same as that illustrated in FIG. 3 due to the resistance 262 in the part where the p-body region 131 is in contact with the Ni source electrode 30.

Also in this embodiment, the conduction characteristics of the parasitic diode 23 illustrated in the third quadrant of FIG. 2 are blocked by the resistance 262, and with respect to reverse conduction characteristics illustrated in the third quadrant of FIG. 2, the characteristics only of the MOSFET 27 appear as in the first embodiment. In this arrangement, also with respect to a reverse bias, the drain current flowing through the device can be controlled by the gate voltage without increasing the current loss. As a result, not only AC signals can be controlled only by the gate-source voltage $V_{GS}$ of an n-channel type DMOSFET, but also, as there is no need for an external resistance, the number of parts and components can be reduced. Furthermore, as the structure except for the semiconductor material is the same as that of conventional MOSFETs, the time required for design, for example, is not more than the time required for conventional MOSFETs.

[Sixth Embodiment]

The sixth embodiment of a semiconductor device according to the present invention will be described with reference to the appended figures.

Figure 8:
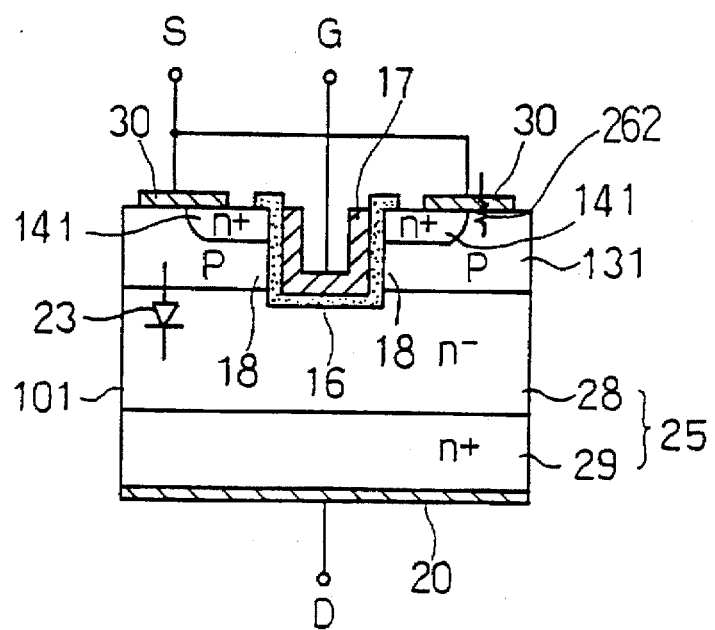
FIG. 8 is a cross-sectional view illustrating the sixth embodiment of an n-channel type UMOSFET according to the present invention.

FIG. 8 is a cross-sectional view illustrating the sixth embodiment of an n-channel type UMOSFET 101 according to the present invention. Schematically, in this embodiment of the n-channel type UMOSFET 101, a semiconductor substrate 25, a p-body region 131 and an n$^+$ source region 141 are hexagonal system SiC single crystals as in the fifth embodiment. Here, the azimuth of the surface of the semiconductor substrate 25 is on the (0001) plane, and on this plane is formed a p-body region 131 by epitaxial growth. A trench of a gate oxide film (insulating film) 16 is formed extending from the top side of the substrate to the n$^-$ SiC layer 28, and through the gate oxide film (insulating film) 16 is formed a gate electrode 17. In addition, a Ni source electrode 30 electrically in contact with and common to the p-body region 131 and the n$^+$ source region 141 is formed using nickel ("Ni"). In this arrangement, the contact resistance of the part where the p-body region 131 is in contact with the Ni source electrode 30 is set to be larger than that of the part where the n$^+$ source region 141 is in contact with the Ni source electrode 30, and a resistance 262 is substantially formed within the part where the p-body region 131 is in contact with the Ni source electrode 30. Accordingly, the equivalent circuit of the n-channel type UMOSFET illustrated in FIG. 8 is substantially the same as that illustrated in FIG. 3 due to the resistance 262 within the part where the p-body region 131 in contact with the Ni source electrode 30, and the electric characteristics thereof are the same as those illustrated in FIG. 2.

Also in this embodiment, the conducting characteristics of the parasitic diode 23 illustrated in the third quadrant of FIG. 2 are blocked by the resistance 262, and with respect to reverse conducting characteristics illustrated in the third quadrant of FIG. 2, the characteristics only of the MOSFET 27 appear as in the first embodiment. As a result, not only can AC signals be controlled using only the gate-source voltage $V_{GS}$ of an n-channel UMOSFET 101, but also as there is no need for an external resistance, the number of parts and components can be reduced. Furthermore, as the structure except for the semiconductor material is the same as that of conventional MOSFETs, increases in the time required for design, for example, can be avoided.

As described in the first through sixth embodiments above, the source electrode is divided into two source electrodes. One is a source electrode electrically in contact only with the n$^+$ source region, and the other is a base electrode electrically in contact only with the p-body region. The base electrode is connected to the source terminal S through a resistance, or otherwise the source electrode is provided so that the resistance of the part where the p-body area is in contact with the source electrode is set to be larger than that of the part where the n$^+$ source region is in contact with the source electrode to have a resistance substantially formed within the part where the p-body region contacts the source electrode. Accordingly, the conducting characteristics of the parasitic diode are blocked by the resistance, and with respect to the reverse conducting characteristics of the semiconductor device, the characteristics only of the MOSFET appear. As a result, the semiconductor device can securely be turned ON and OFF by the gate-source voltage even if the semiconductor device is reverse biased. In this arrangement, AC signals can be controlled only by a single semiconductor device. Furthermore, according to the present invention, increase in voltage drop in forward conduction characteristics does not occur.

Figure 9:
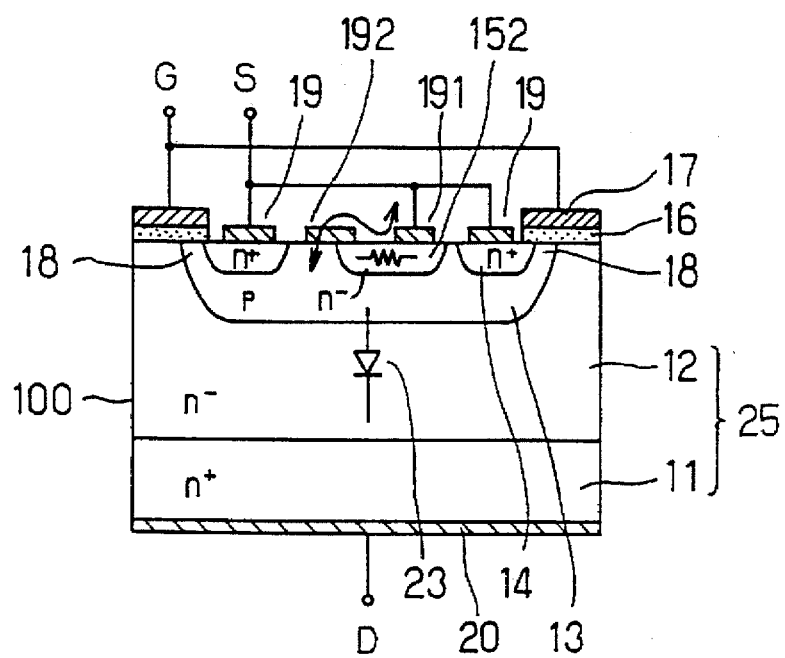
FIG. 9 is a cross-sectional view illustrating an applied embodiment of an n-channel type DMOSFET according to the present invention.

It should be noted here that the resistance used in the first and third embodiments may either be connected to the outside or buried inside as illustrated in FIG. 9 (in this case, although a resistance layer is formed within the p-body region, the resistance layer may be formed within any other separate region on the semiconductor substrate), for example. In addition, as described above, when the semiconductor device is actually used as a power semiconductor device, thousands of the unit cells illustrated are connected. Therefore, when the resistance is connected to the outside, the resistance may be connected for each unit cell. However, it is preferable that one resistance should be used for the whole device or in any block unit for higher productivity.

Furthermore, in the second and fourth embodiments, the base layer 15 is set to be p$^-$ type. However, the base layer 15 may be set to be a compensation type (intrinsic type) or a non-doped layer to further increase the resistance therein. If the base layer 15 is set to be an n type or n⁻ type in this structure, an energy barrier is produced between the base layer 15 and the p-body region 13. Therefore, when the base layer 15 of FIG. 4 is set to be an n type or n⁻ type, as shown by n⁻ base layer 152 in FIG. 9, it is preferable that an electrode 192 should be included within the structure as illustrated in FIG. 9, for example.

Figure 10:
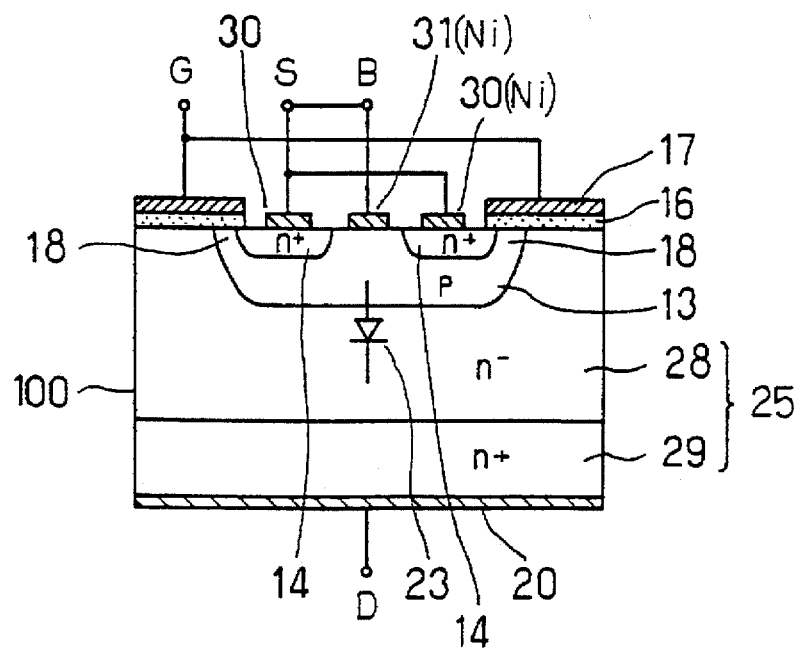
FIG. 10 is a cross-sectional view illustrating another applied embodiment of an N-channel type DMOSFET according to the present invention.
Figure 11:
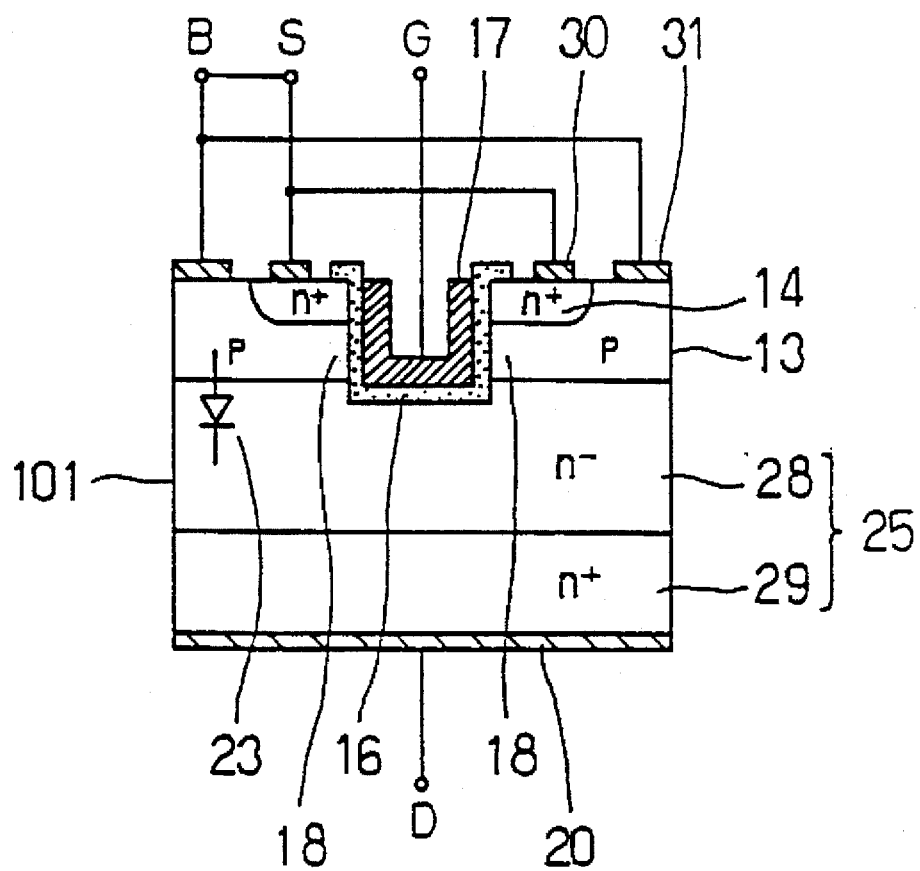
FIG. 11 is a cross-sectional view illustrating still another applied embodiment of an n-channel type UMOSFET according to the present invention.
Figure 12:
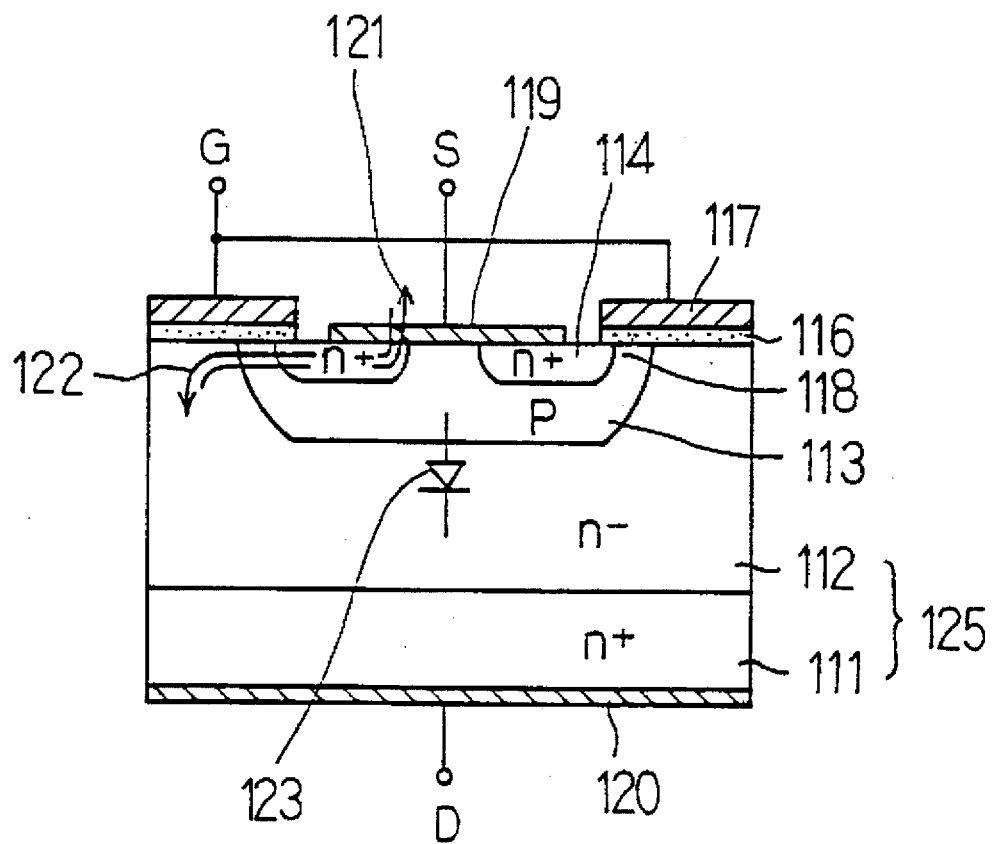
FIG. 12 is a cross-sectional view illustrating a conventional n-channel type DMOSFET.

On the other hand, in the fifth and sixth embodiments, the source electrode 30 may be divided into a source electrode 30 and a base electrode 31 as illustrated in FIGS. 10 and 11. In these embodiments, nickel is used as the material of the electrode, which provides high contact resistance to p⁻ type SiC and low contact resistance to n⁺ SiC. However, any material, such as aluminum (Al), Nickel (Ni), Nickel alloy, or aluminum alloy, may be used as long as the material has the characteristics described above. In addition, the structure of the trench described above is not limited to that illustrated in the figure, and may be U-shaped or V-shaped, for example.

Although the above description refers only to the n-channel type, the same effect can be obtained by a p-channel type in which the conductivity type n and p are interchanged. In addition, the present invention is not limited to power MOSFETS, but may be applied to any other type of vertical MOSFET. In the above description, a plurality of positions are disclosed as parts at which the resistance is provided, including the inside of the semiconductor substrate, outside thereof, and the electrode contacting part. However, it is needless to say that various modifications are possible for blocking the conducting characteristics of a parasitic diode, and these modifications are included within the scope of the claims.

What is claimed is:

1. A semiconductor device having a vertical MOSFET structure, comprising:

a semiconductor substrate having a low-resistance semiconductor layer of a first conductivity type and a high-resistance semiconductor of the first conductivity type disposed on said low-resistance semiconductor layer;

a body region of a second conductivity type disposed on said semiconductor substrate, a PN junction being defined between said body region and said semiconductor substrate;

a source region of the first conductivity type disposed within said body region and having a resistance lower than that of said high-resistance semiconductor layer;

a gate electrode located on a surface of said body region with an insulating film disposed between said gate electrode and said body region for forming a channel region near said surface of said body region between said high-resistance semiconductor layer and said source region, wherein said semiconductor substrate, said body region, said source region and said gate electrode collectively form said vertical MOSFET structure;

a source electrode contacting said source region, a first electric potential between said semiconductor substrate and said source electrode being applied causing a first current flowing through said vertical MOSFET structure to flow in a forward direction during a first mode and a second electrical potential being applied between said semiconductor substrate and said source electrode causing a second current to flow in a reverse direction during a second mode;

current controlling means comprising a resistor connected between said body region and said source electrode, said first electric potential causing said PN junction to be reverse biased and said second electric potential causing said PN junction to be forward biased; and gate voltage control means for forming said channel region by applying a same voltage to said gate electrode in said first and second modes, wherein said resistor has a resistance value which controls a parasitic diode current flowing through a parasitic diode formed by said PN junction to be smaller than said second current flowing through said channel region during said second mode when said second electric potential is applied, wherein currents flowing through said vertical MOSFET structure are determined by said first and second currents flowing through said channel region in said first and second modes, respectively, and wherein said currents flowing through said vertical MOSFET are currents flowing through said channel region formed by said gate voltage control means.

2. A semiconductor device according to claim 1, further comprising a base electrode contacting said body region, wherein said resistor of said current controlling means includes an external resistor connected between said base electrode and said source electrode for controlling said parasitic diode current to be smaller than said second current flowing through said channel region during said second mode.

3. A semiconductor device according to claim 1, wherein said current controlling means includes a base region which is a semiconductor diffusion layer formed of one of the second conductivity type and an intrinsic type such that a resistance of said semiconductor diffusion layer is higher than a resistance of said body region, and wherein said source electrode electrically contacts both said source region and said base region.

4. A semiconductor device according to claim 3, wherein:
said base region is of said second conductivity type; and
an impurity concentration of said base region is lower than an impurity concentration of said channel region, thereby setting a resistance of said resistor in said current controlling means.

5. A semiconductor device according to claim 1, wherein a trench is formed penetrating said body region and reaching said semiconductor substrate, and wherein said source region is formed on a side face of said trench within said body region with a distance to said semiconductor substrate, said channel region being defined by said distance.

6. A semiconductor device according to claim 1, wherein said resistor of said current controlling means includes a contact resistance between said body region and said source electrode, said source electrode contacting both said body region and said source region and being made of a material which makes, in association with said body region, the contact resistance between said body region and said source electrode higher than a contact resistance between said source region and said source electrode.

7. A semiconductor device according to claim 6, wherein said semiconductor substrate, said body region and said source region are made of silicon carbide (SiC), and said source electrode is selected from the group comprising nickel (Ni), aluminum (Al), nickel alloy and aluminum alloy.

8. A semiconductor device according to claim 7, wherein said semiconductor substrate, said body region and said source region are made of hexagonal system single crystal silicon carbide (SiC).

9. A semiconductor device according to claim 5, wherein:
said body region is a p-type region; and
said source region is an n-type region.

10. A semiconductor device according to claim 9, wherein an azimuth of a surface of said semiconductor substrate is on a (0001) plane.

11. A semiconductor device according to claim 6, wherein said source electrode includes a first electrode portion contacting said source region and a second electrode portion contacting said body region, and said second electrode portion is made of said material which makes in association with said body region said contact resistance between said body region and said second electrode portion higher than said contact resistance between said source region and said first electrode portion.

12. A semiconductor device according to claim 1, wherein said first conductivity type is an n-type and said second conductivity type is a p-type.

13. A semiconductor device according to claim 1, wherein said first conductivity type is a p-type and said second conductivity type is an n-type.

14. A semiconductor device according to claim 1, said semiconductor device comprising an n-channel type U-shaped gate MOSFET.

15. A semiconductor device according to claim 1, said semiconductor device comprising an n-channel type double diffused MOSFET.

16. A semiconductor device according to claim 1, wherein said first and second electrical potentials result from alternating current signals applied between said source electrode and said semiconductor substrate.

17. A semiconductor device having a vertical MOSFET structure, comprising:
a semiconductor substrate having a low-resistance semiconductor layer of a first conductivity type and a high-resistance semiconductor layer of the first conductivity type disposed on said low-resistance semiconductor layer;
a body region of a second conductivity type disposed on said semiconductor substrate, a PN junction being defined between said body region and said semiconductor substrate;
a source region of the first conductivity type disposed within said body region and having a resistance lower than a resistance of said high-resistance semiconductor layer;
a gate electrode located on a surface of said body region, with an insulating film being disposed between said gate electrode and said surface of said body region, for forming a channel region near said surface of said body region between said high-resistance semiconductor layer and said source region, wherein said semiconductor substrate, said body region, said source region and said gate electrode collectively form said vertical MOSFET structure;
a source electrode contacting said source region, a first electric potential being applied between said semiconductor substrate and said source electrode during a first mode causing a first current flowing through said vertical MOSFET structure to flow in a forward direction and a second electric potential being applied between said semiconductor substrate and said source electrode during a second mode causing a second current to flow in a reverse direction;

a resistor externally connected between said body region and said source electrode, said first electric potential causing said PN junction to be reverse biased and said second electric potential causing said PN junction to be forward biased; and
gate voltage control means for forming said channel region by applying a same voltage to said gate electrode in said first and second modes,
wherein said resistor has a resistance value which controls a parasitic diode current flowing through a parasitic diode formed by said PN junction to be smaller than said second current flowing through said channel region during said second mode when said second electric potential is applied, and
wherein currents flowing through said vertical MOSFET structure are determined by said first and second currents flowing through said channel region in said first and second modes, respectively, and
wherein said currents flowing through said vertical MOSFET are currents flowing through said channel region formed by said gate voltage control means.

18. A semiconductor device according to claim 17, wherein said first conductivity type is an n-type and said second conductivity type is a p-type.

19. A semiconductor device according to claim 17, wherein said first conductivity type is a p-type and said second conductivity type is an n-type.

20. A semiconductor device according to claim 17, wherein said semiconductor device comprises an n-channel type U-shaped gate MOSFET.

21. A semiconductor device according to claim 17, wherein said semiconductor device comprises an n-channel type double diffused MOSFET.

22. A semiconductor device according to claim 17, wherein said first and second electrical potentials result from alternating current signals applied between said source electrode and said semiconductor substrate.

23. A semiconductor device having a vertical MOSFET structure, comprising:
a semiconductor substrate having a low-resistance semiconductor layer of a first conductivity type and a high-resistance semiconductor layer of the first conductivity type disposed on said low-resistance semiconductor layer;
a plurality of vertical MOSFET cells integrated in parallel on said semiconductor substrate, each of said vertical MOSFET cells comprising:
a body region of a second conductivity type disposed on said semiconductor substrate with a PN junction defined between said body region and said semiconductor substrate,
a source region of the first conductivity type disposed within said body region and having a resistance lower than a resistance of said high-resistance semiconductor layer, and
a common gate electrode located on a surface of said body region with an insulating film disposed between said common gate electrode and said surface of said body region for forming a channel region near said surface of said body region between said high-resistance semiconductor layer and said source region;
a common source electrode contacting said respective source regions;
a common drain electrode contacting said low-resistance semiconductor layer, wherein during a first mode, a first electric potential is applied between said semiconductor substrate and said source electrode causing a first current flowing between said common source electrode and said common drain electrode to flow in a forward direction and during a second mode, a second electric potential is applied between said semiconductor substrate and said source electrode causing a second current to flow in a reverse direction;

a resistor connected between said respective body regions and said common source electrode, said first electric potential causing said respective PN junctions to be reverse biased and said second electric potential causing said respective PN junctions to be forward biased; and gate voltage control means for forming said channel regions by applying a same voltage to said common gate electrode in said first and second modes, wherein said resistor has a resistance value which controls a parasitic diode current flowing through a parasitic diode formed by said PN junction in each of said vertical MOSFET cells to be smaller than said second current flowing through each of said channel regions of said vertical MOSFET cells during said second mode when said second electric potential is applied, and wherein currents flowing through said vertical MOSFET cells are said first and second currents flowing through each of said channel regions formed by said gate voltage control means.

24. A semiconductor device according to claim 23, wherein said first conductivity type is an n-type and said second conductivity type is a p-type.

25. A semiconductor device according to claim 10, wherein said first conductivity type is a p-type and said second conductivity type is an n-type.

26. A semiconductor device according to claim 23, wherein said semiconductor device comprises an n-channel type U-shaped gate MOSFET.

27. A semiconductor device according to claim 23, wherein said semiconductor device comprises an n-channel type double diffused MOSFET.

28. A semiconductor device according to claim 23, wherein said first and second electrical potentials result from alternating current signals applied between said source electrode and said semiconductor substrate.

\* \* \* \* \*